United States Patent [19]

Bowers

[11] Patent Number: 5,670,821
[45] Date of Patent: Sep. 23, 1997

[54] GUARD RING FOR MITIGATION OF PARASITIC TRANSISTORS IN JUNCTION ISOLATED INTEGRATED CIRCUITS

[75] Inventor: Derek F. Bowers, Sunnyvale, Calif.

[73] Assignee: Analog Devices, Inc., Norwood, Mass.

[21] Appl. No.: 571,562

[22] Filed: Dec. 13, 1995

[51] Int. Cl.$^6$ .................... H01L 29/00; H01L 23/58

[52] U.S. Cl. .................... 257/547; 257/494; 257/556; 257/557

[58] Field of Search .................... 257/490, 494, 257/495, 547, 556, 557

[56] References Cited

FOREIGN PATENT DOCUMENTS

| 58-186947 | 11/1983 | Japan | 257/547 |
| 61-150229 | 7/1986 | Japan | 257/547 |

*Primary Examiner*—Steven H. Loke
*Attorney, Agent, or Firm*—Koppel & Jacobs

[57] ABSTRACT

A guard ring with the same conductivity as a device pocket surrounds the pocket and a pocket isolation ring to establish a parasitic transistor that conducts current between the guard ring and the pocket when the pocket voltage is driven sufficiently below the substrate voltage. The guard ring is connected to a voltage supply for the circuit which, together with its shorter current path, allows the parasitic transistor to harmlessly divert current away from unwanted inter-pocket parasitic transistors.

4 Claims, 3 Drawing Sheets

GUARD RING FOR MITIGATION OF PARASITIC TRANSISTORS IN JUNCTION ISOLATED INTEGRATED CIRCUITS

BACKGROUND OF THE INVENTION

1. Field of the Invention

This invention relates to junction isolated integrated circuits, and more particularly to the reduction of parasitic transistor effects between isolated device pockets.

2. Description of the Related Art

A section of an integrated circuit (IC) with junction isolated pnp transistors is shown in FIG. 1. A typical IC structure of this type includes an n-type epitaxial layer 2 formed on a p-type substrate 4. Separate device pockets 6a, 6b, etc. are formed in the epitaxial layer, separated from each other by p-type isolation rings 8 and each containing one or more transistors or other devices. In the example of FIG. 1, the pockets 6a and 6b are illustrated as having respective lateral pnp bipolar transistors consisting of p-type emitter implants 10a and 10b, p-type collector rings 12a and 12b, and n+ base contacts 14a and 14b outside their respective collector rings. The bases themselves are provided by the n-type epitaxial material between the emitters and the collector rings, with base signals applied via the base contacts 14a, 14b and the intervening epitaxial material. N+ buried layers 16a and 16b are provided between the substrate and the device pockets to assist in lateral current flow.

One problem with this configuration is that a parasitic transistor P1 is established between adjacent pockets, with the n-type epitaxial material within the two pockets forming the collector and emitter, and the p-type substrate acting as the base. The substrate is normally biased at the negative supply voltage level V−, which can be as little as −1 volt. If the voltage level of one pocket is forced below V−, the parasitic transistor P1 will turn on and conduct current between the two adjacent device pockets. This can seriously interfere with the operation of the devices in both pockets. The situation is illustrated in FIG. 1 by assuming that the base voltage applied to contact 14b in pocket 6b has dropped below V−. If the voltage differential exceeds the usual npn transistor base emitter voltage drop, typically about 0.7 volts, parasitic transistor P1 turns on, with the epitaxial regions of pockets 6a and 6b respectively acting as the collector and emitter and the substrate 4 as the base.

A simplified diagram of a circuit that is subject to this problem is given in FIG. 2. The circuit is the input stage of an operational amplifier, consisting of a pair of pnp transistors Q1 and Q2 having their collectors connected to V−, their emitters connected through a current source I1 to the positive supply voltage line V+, and their bases connected to receive respective input signals IN1 and IN2. Assuming that transistors Q1 and Q2 are respectively implemented in pockets 6a and 6b of FIG. 1, when the input signal to Q2 goes more than about 0.7 volts below V− the parasitic transistor P1 will turn on and conduct current from IN1 to IN2. Conversely, if the input to Q2 is driven far enough below V−, P1 will conduct in the opposite direction from IN2 to IN1. In either event circuit will not operate properly.

In a prior attempt to inhibit the formation of the parasitic transistor, buried layers were provided at the bottom of the isolation rings to inhibit current flow between adjacent device pockets. This technique was not very effective, however, since most of the carriers tunneled below the isolation buried layers.

Another complicating factor is that parasitic transistors can be formed not only between immediately adjacent pockets, but also between more remotely located pockets, and the location of the parasitics that may be formed in any particular situation is somewhat unpredictable. While theoretically the parasitics could be defeated by spacing the transistors very far away from each other, this is not practical because it would require too much chip area.

SUMMARY OF THE INVENTION

The present invention seeks to provide an IC structure that overcomes the parasitic transistor problem described above without adding unduly to the required amount of chip area, and without complicating the IC fabrication process.

The invention effectively inhibits parasitic transistor action between active devices in different pockets by deliberately introducing a harmless parasitic transistor which in effect short circuits the unwanted parasitic so that the unwanted parasitic conducts much less current. This is accomplished by surrounding each device pocket and isolation ring with a doped guard ring of the same conductivity as the pocket. A voltage is applied to the guard ring of opposite polarity to the pocket voltage which causes the unwanted parasitic transistor to turn on. For pnp pocket transistors, the voltage applied to the guard ring is preferably the positive supply voltage V+. The deliberately formed parasitic transistor is highly efficient because of its connection to V+, and also because it has a shorter current path than the unwanted parasitics. Most of the pocket transistor's base current is thus supplied harmlessly from V+, rather than from some other unpredictable pocket. The invention is also applicable to npn pocket transistors by reversing both the conductivities of the IC elements and the polarity of the voltage applied to the guard ring.

These and other features and advantages of the invention will be apparent to those skilled in the art from the following detailed description, taken together with the accompanying drawings, in which:

DETAILED DESCRIPTION OF THE INVENTION

Figure 1:
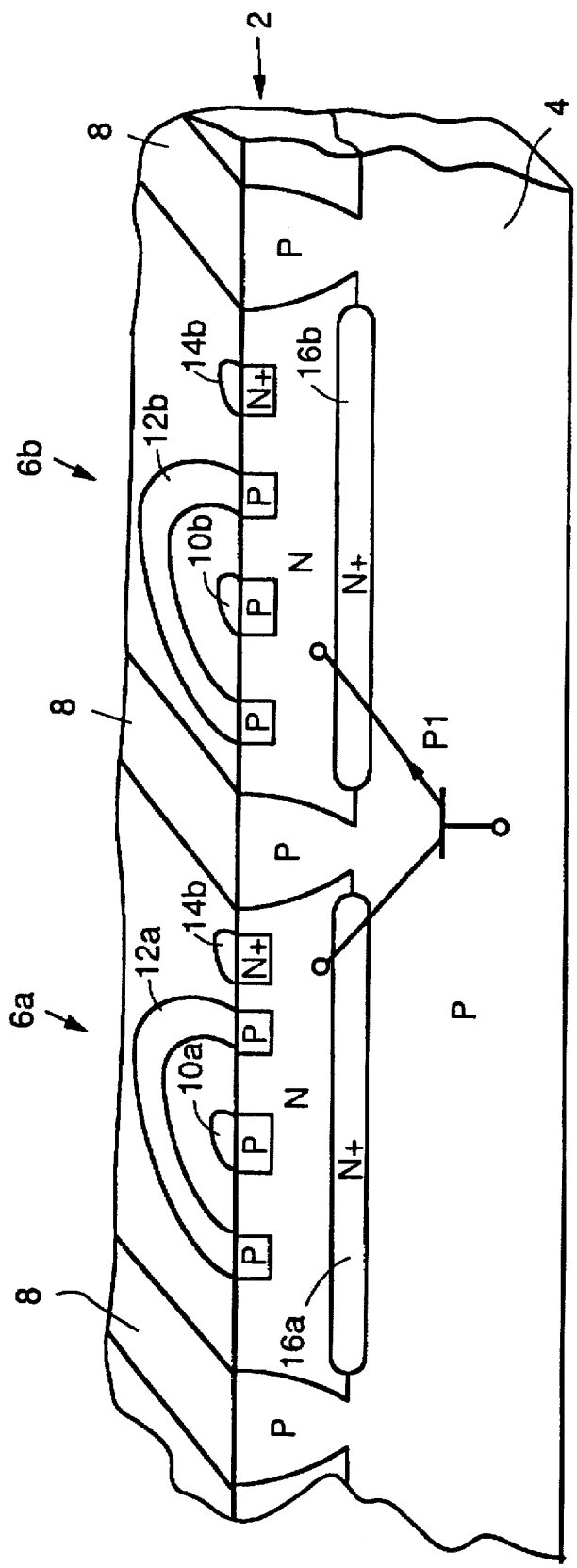
FIG. 1 is a fragmentary perspective view (not to scale), described above, of a conventional IC with lateral pnp transistors.
Figure 3:
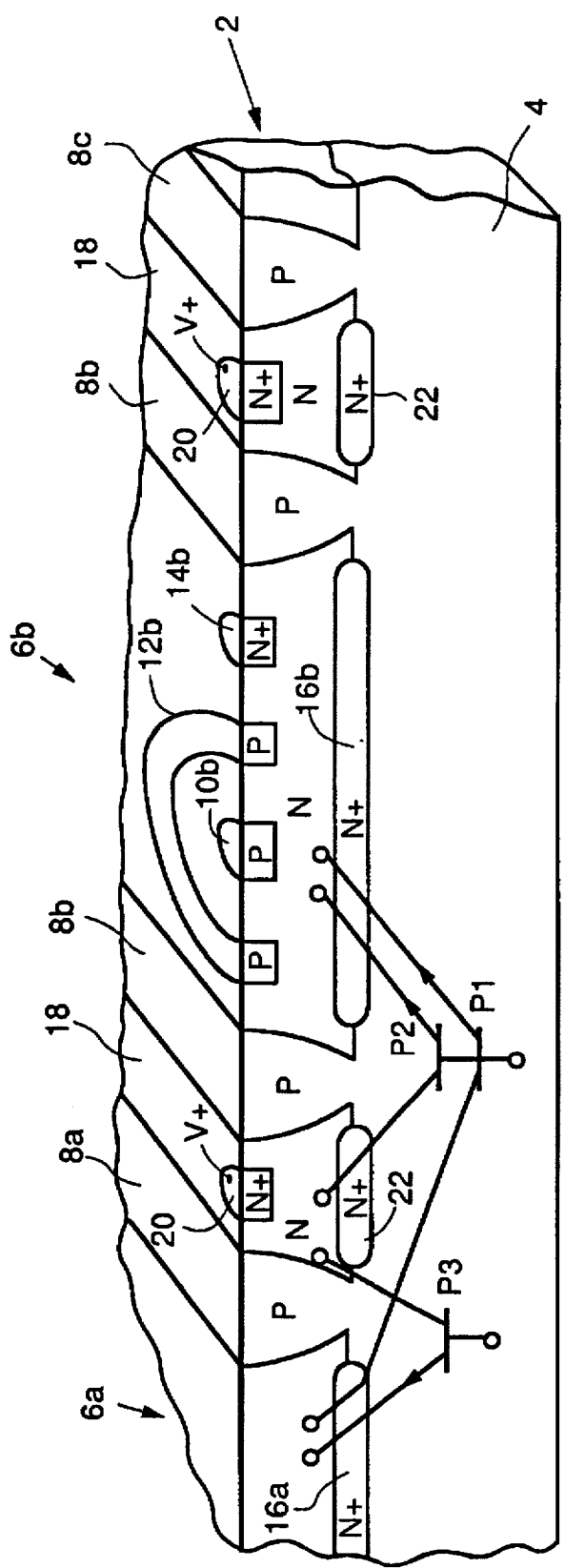
FIG. 3 is a fragmentary perspective view showing the IC of FIG. 1 modified to incorporate the invention.

The basic principals of the invention are illustrated in FIG. 3, in which elements that are the same as in FIG. 1 are identified by the same reference numbers. However, structural details of the transistor formed in pocket 6a are not shown in FIG. 3.

Rather than separating device pockets with a single isolation ring 8, the invention adds a guard ring 18 that surrounds each pocket to be protected and its associated isolation ring. The guard rings 18 are formed in the epitaxial region and have the same doping conductivity as the rest of the epitaxial region, which is n-type for the pnp pocket transistor illustration of FIG. 3. Highly conductive guard ring contacts 20 are implanted into the upper surfaces of the guard rings, and are preferably connected to the same V+ line that provides the positive voltage supply for the remainder of the circuitry. This results in a second npn parasitic transistor P2 having its emitter formed by the epitaxial region of pocket 6b, its base by the substrate 4, and its collector by the guard ring 18 (rather than by the epitaxial region of some other pocket). P2 and P1 are shown with a common base connection to the substrate.

It can be seen from FIG. 3 that the current path for P1, from pocket 6a to pocket 6b, is longer than the current path for P2 from the guard ring 18 to the pocket 6b. Similarly, the guard ring establishes another parasitic transistor P3 with its collector in the guard ring, its emitter in the epitaxial region of pocket 6a, and its base again in the substrate; the current path of P3 is again shorter than that for P1.

Because of both the application of V+ to the guard rings and the shorter current paths of their associated parasitic transistors, a much greater current flows through the deliberately added parasitic transistor P2 than through P1 when the base of the transistor in pocket 6b is driven sufficiently negative. Similarly, much more current flows through parasitic transistor P3 than through P1 when the base of the pocket 6a transistor is driven sufficiently negative (the collector and emitter of P1 are reversed under this condition). N+ buried layers 22 are provided between the guard rings and the substrate to reduce the resistance to the desired parasitic current flow. Since the current flow from P2 or P3 is from V+ rather than another device pocket, the cross-interference between different device pockets is greatly reduced.

In this embodiment each device pocket to be protected is surrounded by its own isolation ring, as well as a guard ring. The isolation rings for pockets 6a and 6b are labeled 8a and 8b, respectively.

There is a considerable leeway in the doping concentrations for the various elements. However, the following order of magnitude doping concentrations (in atoms/cm$^3$) may be taken as typical:

guard ring and epitaxial layer: $10^{15-16}$ substrate: $10^{15-17}$ emitter and collector implants: $10^{18}$ guard ring and base contacts: $10^{21}$ buried layers: $10^{19}$ One of the advantages of the invention is that it does not require the addition of any fabrication steps. Rather, the guard rings can be formed simply by modifying the masks used in the normal fabrication process. The guard ring buried layers 22 are preferably formed at the same time as the pocket buried layers 16a, 16b, the guard ring contacts 20 at the same time as the base contacts 14a, 14b, and any additional isolation rings at the same time as the other isolation rings.

Since the base current for a pocket transistor is substantially constant for a given level of base voltage drive, the addition of parasitic transistor P2 will not significantly change the total current provided to the pocket epitaxial region. However, it will divert the source of most of that current from other pockets to the positive voltage supply. This greatly reduces the amount of cross-pocket interference.

Figure 4:
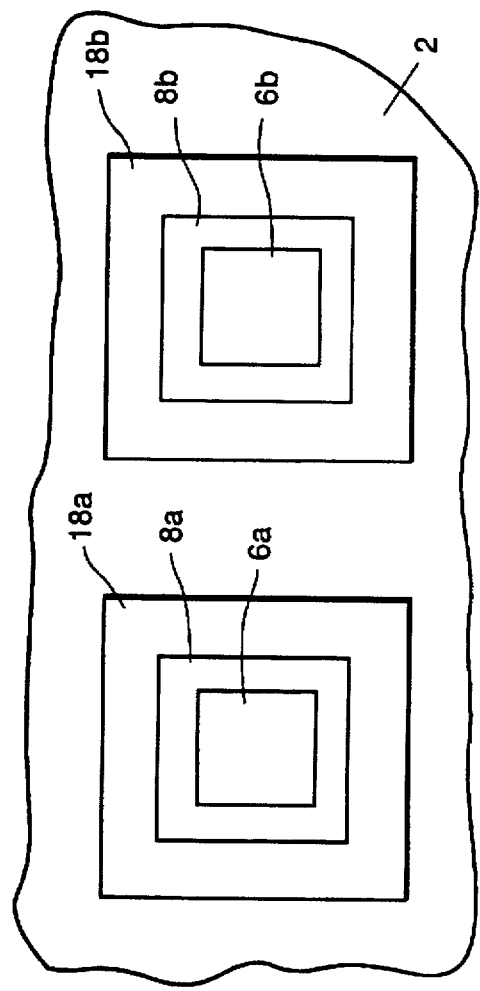
FIG. 4 is a plan view showing the protection of two device pockets with separate guard rings.
Figure 5:
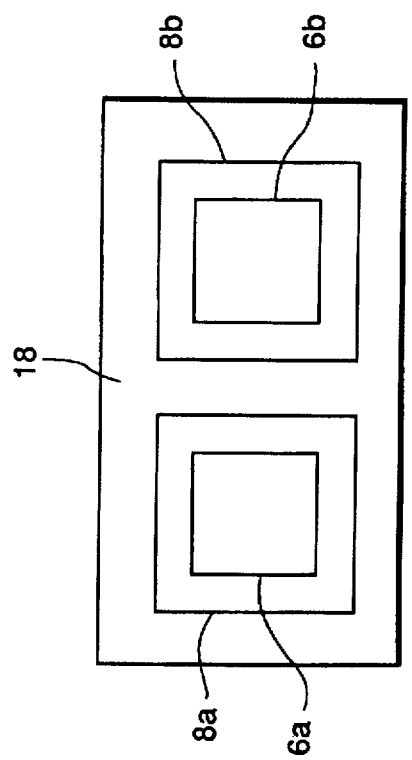
FIG. 5 is a plan view illustrating the protection of two device pockets with a merged guard ring.
Figure 2:
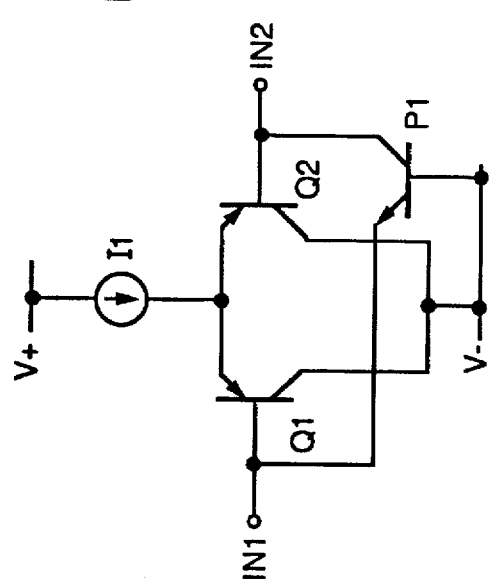
FIG. 2 is a simplified schematic diagram, described above, of an input stage to an operational amplifier.

FIG. 4 is a simplified plan view showing two device pockets 6a and 6b that are completely surrounded by respective isolation rings 8a and 8b, which in turn are surrounded by guard rings 18a and 18b. In this case the two guard rings are separated by isolation material. To save chip area the pockets could be arranged as shown in FIG. 5, which corresponds more closely to the geometry of FIG. 3. In this case the device pockets 6a and 6b are again surrounded by respective isolation rings 8a and 8b, but the individual guard rings have been merged so that the two pocket/isolation ring combinations are separated by a single guard region 18. Similarly, additional device pockets and associated isolation rings could be positioned immediately adjacent the outer edges of the guard region 18, with the common guard region extended to surround each added pocket/isolation ring.

While particular embodiments of the invention have been shown and described, numerous variations and alternate embodiments will occur to those skilled in the art. For example, while the invention has been described in terms of pnp pocket transistors and a p-type substrate, it could be easily modified for npn pocket transistors and an n-type substrate by doping the guard region p-type and connecting it to a negative voltage source such as V−. Accordingly, it is intended that the invention be limited only in terms of the appended claims.

I claim:

1. A parasitic protected, junction isolated integrated circuit (IC), comprising:

a substrate having a doping of one conductivity, a first integrated circuit device pocket in said substrate with a doping conductivity opposite to the substrate doping, a first active transistor in said device pocket having doped emitter, base and collector regions with respective doping concentrations, a first isolation ring surrounding said pocket, a doped guard ring with the same conductivity as said pocket surrounding said isolation ring and, together with said pocket and said substrate, forming a first parasitic transistor, said guard ring having a doping concentration at least about 100 times less than said emitter and collector region doping concentrations, said guard ring having the same type doping conductivity as said active transistor base region, said active transistor base region being integral with said pocket and forming the emitter of said parasitic transistor, and a contact for applying a voltage to said guard ring.

2. The integrated circuit of claim 1, further comprising a second integrated circuit device pocket in said substrate with a doping conductivity the same as said first device pocket, and a second isolation ring which surrounds said second device pocket and is separated from said first isolation ring by said guard ring, said guard ring together with said second pocket and said substrate forming a second parasitic transistor, and said first and second pockets together with said substrate forming a third parasitic transistor that has a substantially longer current path than either of said first or second parasitic transistors.

3. The integrated circuit of claim 2, said second device pocket including a second active transistor.

4. The integrated circuit of claim 1, further comprising a buried layer of opposite conductivity to said substrate between said substrate and at least a portion of said guard ring.

* * * * *